(12) United States Patent
Kung

(10) Patent No.: US 6,218,902 B1
(45) Date of Patent: Apr. 17, 2001

(54) WIDE-BAND LINEARIZATION TECHNIQUE

(75) Inventor: William Kung, Nepean (CA)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/294,315

(22) Filed: Apr. 20, 1999

(51) Int. Cl.[7] .................................................. H03F 3/45
(52) U.S. Cl. .................................... 330/261; 330/300
(58) Field of Search .................................. 330/252, 253, 330/261, 300

(56) References Cited

U.S. PATENT DOCUMENTS

| | | | |
|---|---|---|---|
| 3,619,797 | * 11/1971 | Merrick | 330/9 |
| 3,743,764 | * 7/1973 | Wittmann | 178/5.4 |
| 4,442,408 | * 4/1984 | Le | 330/261 |
| 5,530,444 | * 6/1996 | Tice et al. | 341/156 |

OTHER PUBLICATIONS

B. Gilbert "The Micromixer: A Highly Linear Variant of the Gilbert Mixer Using a Bisymmetric Class–AB Input Stage", IEEE Journal of Solid–State Circuits, vol. 32, No. 9, Sep. 1997; pp. 1412 to 1423.

Z. Wang, "A Linearized Source–Coupled Pair with a Dynamic Bias Current", Microelectronics Journal, 23 (1992) pp. 301–304.

J. Durec, E. Main, D. Lovelace, "Motorola's Mosaic™ V silicon Bipolar RF Building Blocks Fill Gaps in High Performance Low Power Wireless Chip Sets", Proc. 4th Wireless Symposium, 1996, Santa Clara, CA. pp. 218–223.

* cited by examiner

*Primary Examiner*—Robert Pascal
*Assistant Examiner*—Henry Choe

(57) ABSTRACT

A conventional differential transistor pair is provided with a dynamic bias circuit. The input voltage signal for the differential pair is also full-wave rectified and the rectified signal is used to bias dynamically the differential pair while the input voltage signal is being applied. One or more bias transistors having a control electrode fed with the rectified signal is connected in series with the differential pair. The result is that as the input signal magnitude increases the amount of bias increases dynamically and increases linearly for larger signals. Desired responses other than linearity can be achieved by making the signal that is fed to the rectifier vary according to any predetermined function.

21 Claims, 8 Drawing Sheets

WIDE-BAND LINEARIZATION TECHNIQUE

FIELD OF THE INVENTION

This invention relates to a basic electronic circuit building block known as a differential transistor pair.

BACKGROUND OF THE INVENTION

The differential transistor pair circuit is a widely-used building block in integrated circuits. An example of a class A differential input circuit, comprised of NPN bipolar junction transistors, is shown in FIG. 1. The small-signal input is usually applied differentially to the bases of transistors Q1 and Q2, and the output is obtained at the collectors. The DC current (hence the class A designation) in the differential pair is set by a constant current source $I_{ee}$ connected to the emitters. The output characteristic is defined by the well-known equation:

$$\Delta i = I_{ee} \tanh\left(\frac{\Delta v}{2V_T}\right)$$

where $\Delta v$ is the differential input voltage (vi+−vi−), $\Delta i$ is the differential output current (io+−io−), $I_{ee}$ is the DC bias current of the differential pair, and $V_T$ is the thermal voltage kT/q.

Advantages of the differential pair may be summarized as:
1) Even-order distortion is suppressed due to the balanced nature of the circuit.
2) Rejection of common-mode signals is high.
3) Rejection of power supply noise and spurious signals is high.
4) The circuit topology is compatible with low cost integrated circuit process technologies.

A disadvantage of the differential input pair is that it has limited input dynamic range in linear applications (i.e. differential inputs larger than a few $V_T$ result in highly nonlinear performance).

Some previous attempts to improve the dynamic range of the basic differential pair have been made. For example, in a well-known technique, emitter degeneration resistors are employed at the emitters of the transistors to linearize the input. The scheme, unfortunately, has the added costs of higher noise due to the resistors, and lower transconductance gain:

$$\frac{di}{dV} \propto \frac{1}{g_m R_e}$$

where $g_m$ is the transconductance of the individual transistors and $R_e$ is the resistive emitter degeneration. For a given $R_e$, it is also common to increase linearity through use of higher static bias (which increases transistor $g_m$), but this approach increases static power consumption and circuit noise.

A circuit implemented in MOS which attempts to deal with the non-linearity problem of the differential pair is disclosed in Zhenhua Wang, "A Linearized Source-coupled Pair with a Dynamic Bias Current," Microelectronics Journal, 23 (1992) 301–304. This is achieved by adding a dynamic current to the constant bias current. More particularly, the differential pair is implemented in MOS as a pair of source-coupled N-type transistors to which is connected an additional pair of source-coupled N-type transistors. This additional pair has its gates connected to the gates of the first pair and a common drain. With the use of current mirrors the sum of the drain currents obtained in the second pair is transferred to the sources of the first pair. The effect is that a dynamic bias current proportional to the square of the input signal voltage is added to a constant bias current.

One drawback of this approach is that it requires two current mirrors each of which introduces delay causing the dynamic bias to lag the input signal thereby limiting the upper bandwidth of the circuit. As well, one of the current mirrors (the one connected to the drains of the second differential pair) has to be formed of P-type transistors and this again limits the high frequency response because the gain of P-type devices at high frequencies is low. Additionally, the dynamic portion of the bias is based on a square law function but this specific type of dynamic bias may not always be what is desired or necessary to improve the circuit performance.

Therefore, there is a need for an improved dynamic biasing technique which overcomes or lessens one or more of these problems.

SUMMARY OF THE INVENTION

The invention involves a bias circuit which dynamically controls the bias of an otherwise conventional class A differential pair. In one embodiment, the input voltage signal which is applied to the differential pair is also applied to a full-wave rectifier which passes a rectified signal to the control electrode of a bias transistor. This provides a dynamic bias which increases in proportion to the magnitude of the input voltage signal. In this way current limiting of the conventional class A differential pair for large input signals is overcome to provide greater linearity.

No current mirrors are used in the signal path and so delay in the circuit is reduced. Also, the dynamic bias circuit can be achieved using N-type transistors which have better high frequency response than P-type devices.

The input voltage signal can be delayed, if desired, to compensate for any delay that may be in the dynamic bias circuit.

Furthermore, although the input voltage signal may be applied unchanged to the rectifier circuit, it could, in other embodiments, be amplitude shifted or phase shifted before passing to the rectifier. Additionally, the voltage applied to the rectifier need not be directly proportional to the amplitude of the input voltage signal but could be programmed as desired by passing the input voltage signal through a signal processor. In this way any desired response may be achieved by the dynamic biasing.

The dynamic biasing may be band limited by incorporating in series with the bias transistor a bandpass filter.

In another embodiment the full-wave rectifier itself acts as the dynamic bias device without requiring an additional bias transistor. The full-wave rectifier in this case is connected between the degeneration resistors of the differential pair and the negative voltage supply.

In yet another exemplary embodiment, two bias transistors are connected separately to respective ones of the differential pair and these bias transistors themselves act as half-wave rectifiers for the input voltage signal again providing dynamic bias to the differential pair.

The invention is applicable to differential or single-ended inputs.

Other aspects and features of the present invention will become apparent to those ordinarily skilled in the art upon review of the following description of the invention in conjunction with the accompanying figures.

DETAILED DESCRIPTION OF THE PREFERRED EMBODIMENTS

Figure 1:
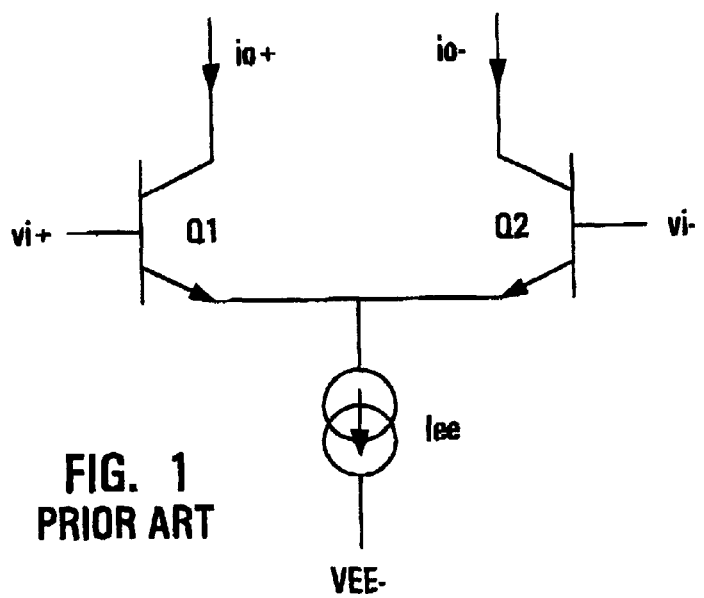
FIG. 1 is a schematic circuit diagram of a basic differential transistor pair.
Figure 2:
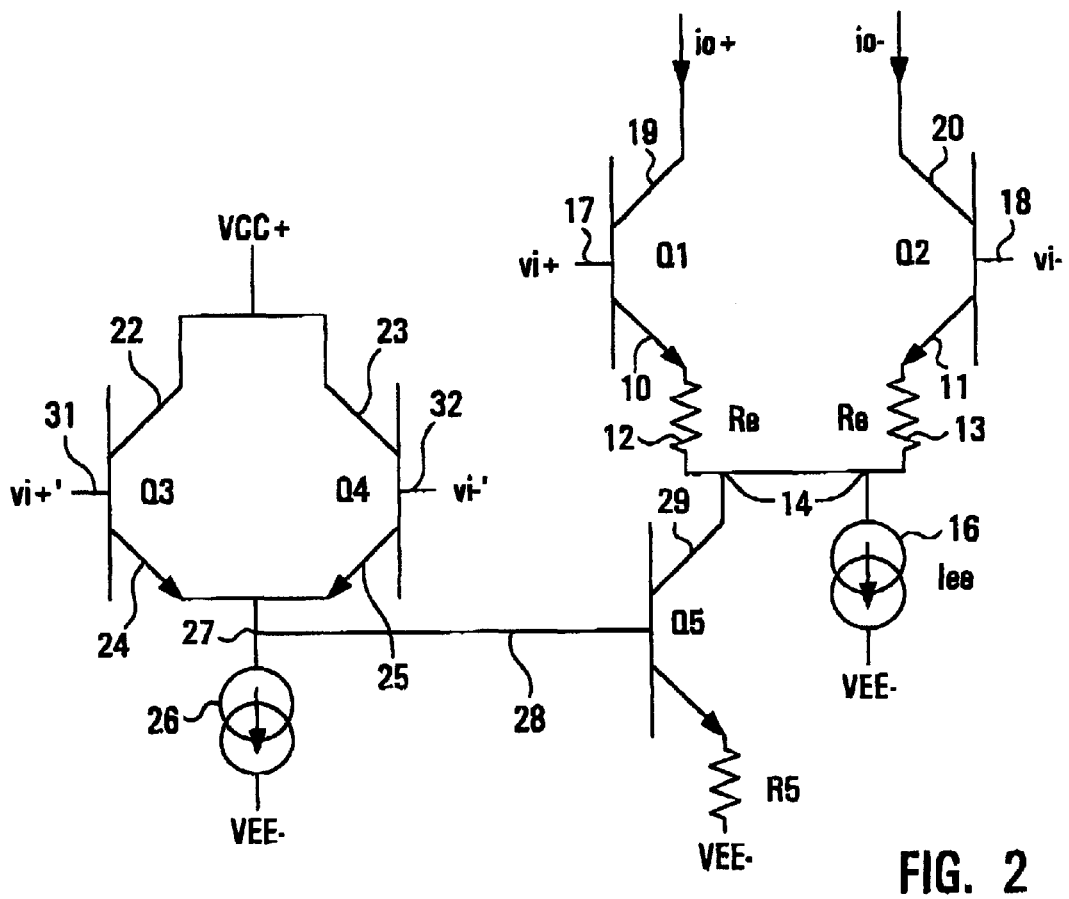
FIG. 2 is a schematic circuit diagram of a differential pair circuit according to the invention.

Referring to FIG. 2, the circuit according to the invention includes a conventional class A differential pair of NPN bipolar transistors Q1 and Q2 having their emitters 10 and 11 connected in common through respective degeneration resistors 12 and 13, respectively.

The junction 14 of the resistors is connected through a constant current source 16 to a negative voltage source VEE−. The constant current source 16 may be constituted simply by a resistor having a suitable value for deriving a desired dc bias current $I_{ee}$ or it may be constituted by a specific semiconductor circuit as is well known in the art. As is conventional, a differential input voltage signal, represented by vi+ and vi− is applied to the bases 17 and 18 of Q1 and Q2 and the output is derived as differential currents io+ and io− in the collectors 19 and 20 of Q1 and Q2.

According to the invention, a dynamic bias circuit is connected to the conventional differential pair. This dynamic bias circuit includes a full wave rectifier formed by two NPN transistors Q3 and Q4 the collectors 22 and 23 of which are connected together to a positive voltage source VCC+ and the emitters 24 and 25 of which are connected together through a constant current source 26 to the negative source VEE−. The junction point 27 between the emitters 24, 25 and the constant current source 26 is connected to the base 28 of an NPN transistor Q5, the collector 29 of which is connected to the junction 14 of resistors 12, 13 and constant current source 16, and the emitter of which is connected through a resistor R5 to the negative supply source VEE−. The transistor Q5 and resistor R5 are the other components of the dynamic bias circuit.

The full wave rectifier is driven by a differential ac voltage applied to the bases 31 and 32 of transistors Q3 and Q4. This differential voltage may be identical of the differential signal applied as input to the bases 17 and 18 of the differential pair Q1 and Q2 and could be derived by a dc coupling to the input differential signal as shown in FIG. 2. Alternatively, the differential voltage applied to bases 31, 32 of the rectifier pair Q3, Q4 could be based on the input differential signal but not an exact replica, for example an ac-coupled, dc level-shifted voltage. As another example the differential voltage applied to the bases 31, 32 could be amplitude shifted or phase shifted with respect to the differential input signal vi+, vi−. Because the two signals must be related in some way the differential voltage applied to bases 31 and 32 is indicated in FIG. 2 with vi+' and vi−'.

In operation, the differential voltage vi+', vi−' applied to bases 31 and 32 is rectified and applied as a bias voltage applied to the base 28 of transistor Q5. This bias voltage causes transistor Q5 to turn on and cause a bias current to flow through transistor Q5 to the emitters 10 and 11 of the differential pair. This bias current is in addition to the normal (static) bias current provided by constant current source 16. The additional bias current provided through transistor Q5 is dynamic in the sense that as vi+', vi−'is increased, the bias current increases in proportion and as vi+', vi−' decreases, the bias current decreases in proportion. As vi+', vi−' is related to vi+, vi−, the input signal to the differential pair, the bias current through transistor Q5 is adjusted (automatically) dynamically in proportion to the input signal vi+, vi−. This has the effect of overcoming current limiting that occurs in the conventional class A differential pair for large input signal amplitudes and eliminates switching distortion in conventional class B/AB differential pairs.

Although as indicated above, the principal use of the invention is to improve wideband linearity between the output signal and the input signal, the dynamic bias circuit according to the invention may be used to generate any desired relationship between the output signal and the input signal of the differential pair, both linear and non-linear.

The principal advantages of the invention are:
1) High linearity can be achieved.
2) High input bandwidth is possible since the technique does not rely on feedback. As well, the technique can be implemented using all N-type devices (e.g., NPN, BJT, NMOS) in the signal and dynamic control path, which allows for highest speed and bandwidth, given the fact that N-type devices are faster than P-type devices.
3) Low static power dissipation is possible since the additional bias is dynamic in nature.
4) Low noise performance is possible since the dynamic bias is applied to the circuit in common-mode.
5) The circuit is fully compatible with commercially-available integrated circuit process technologies. As well, the technique can be implemented with all N-type devices, which makes it compatible with state-of-the-art, high-performance IC technologies.
6) The performance gains that can be achieved with this invention may result in a lower overall product cost through a relaxation in the specifications of other components in the system and through the use of innovative architectures that require higher-linearity components.

Figure 3:
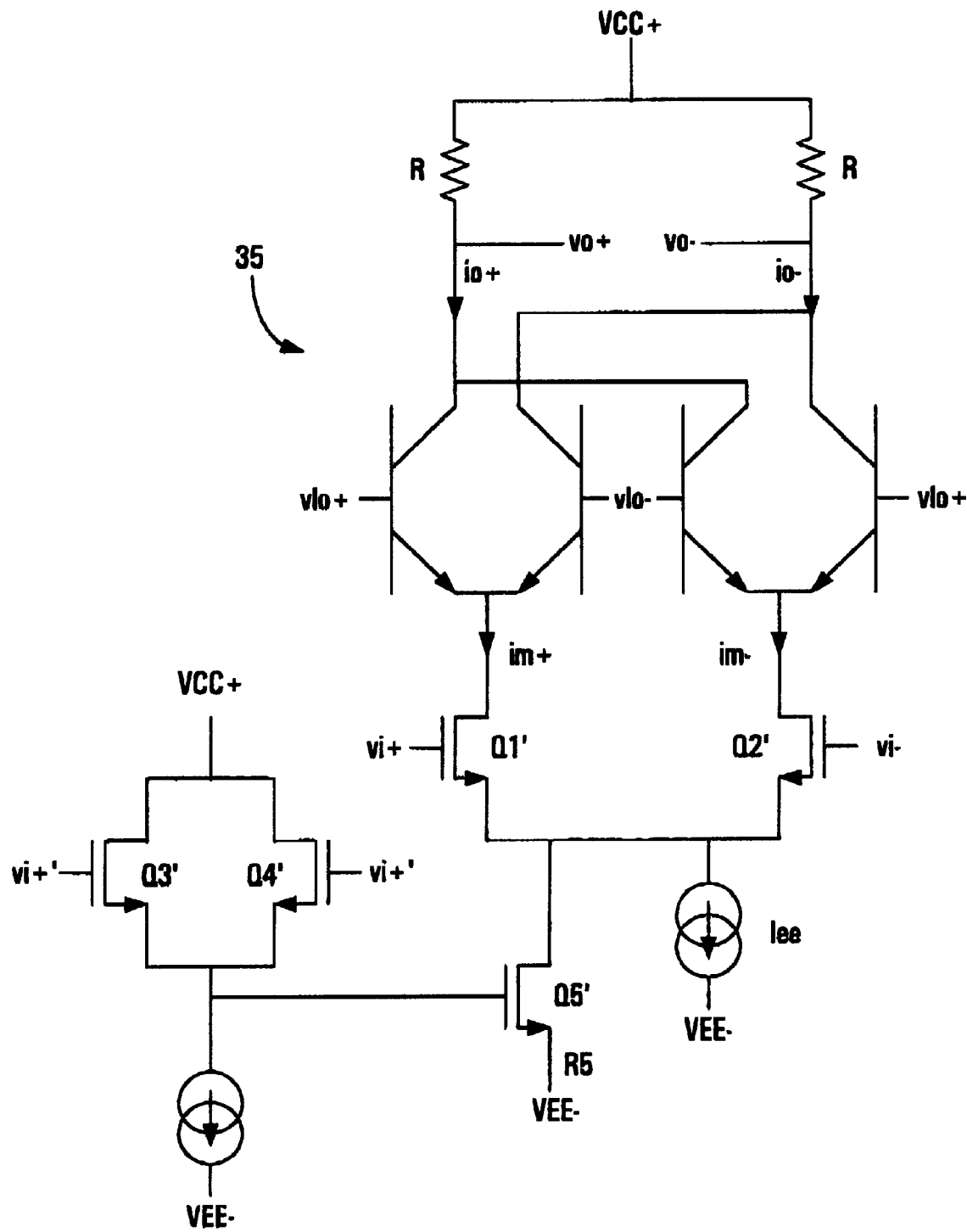
FIG. 3 is a schematic circuit diagram of a mixer circuit incorporating a differential pair circuit according to the invention.

The invention can be applied to most linear circuits that have an input differential pair (e.g. amplifiers, mixers, modulators, phase detectors, etc.) in any number of device and process technologies (e.g. NPN, BJT, PNP BJT, N-FET, P-FET, NMOS, BiCMOS). An example BiCMOS mixer is illustrated in FIG. 3 in which Q1', Q2', Q3', Q4' and Q5' are equivalent to Q1, Q2, Q3, Q4 and Q5 in FIG. 2 except that they are implemented as NMOS transistors. The mixer stage indicated generally by the numeral 35 is conventional and is implemented using two pairs of NPN bipolar transistors biased by a positive voltage source VCC+ connected to the drains of transistors Q1' and Q2'.

Figure 4:
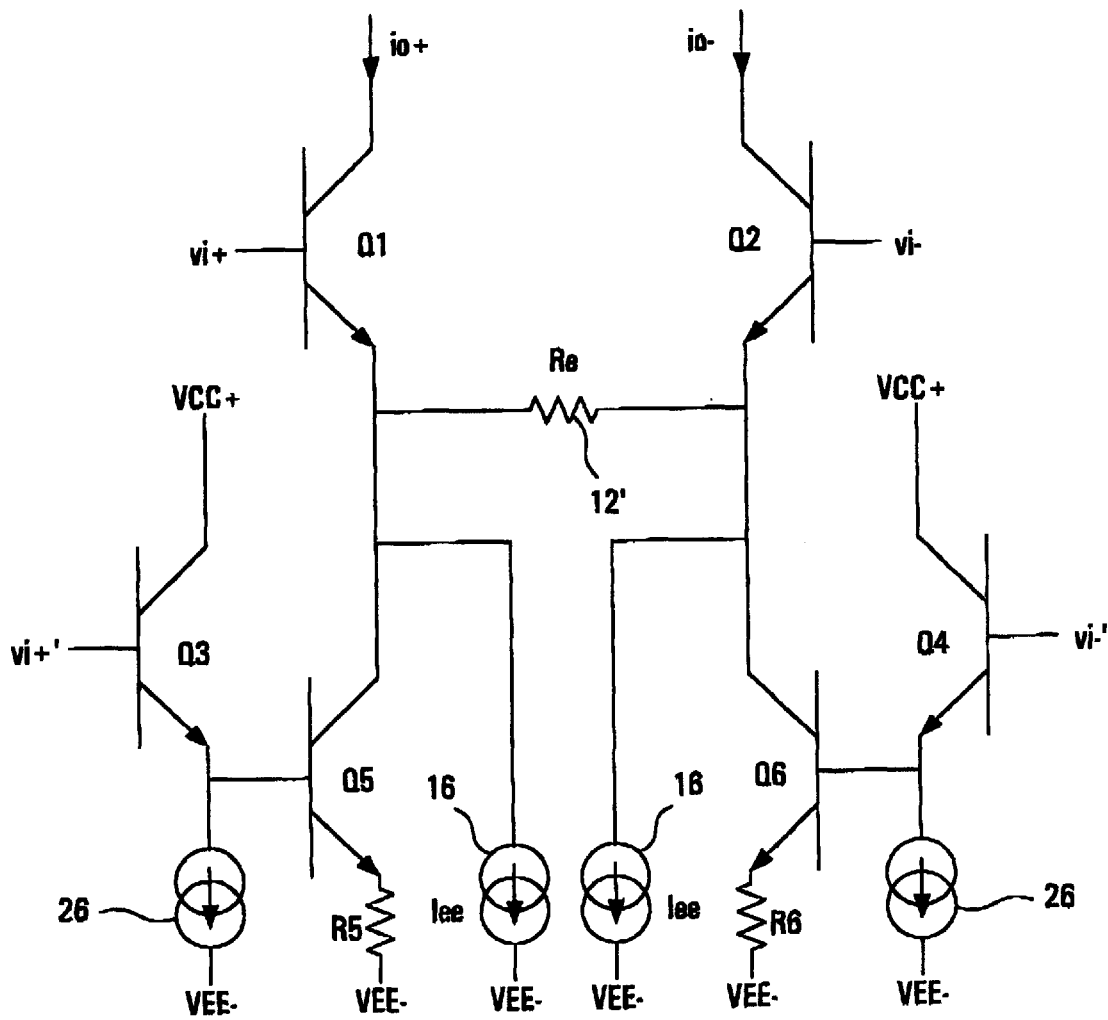
FIG. 4 is a schematic circuit diagram of a differential pair circuit according to an alternative biasing aspect of the invention.

Turning now to FIG. 4, this illustrates a circuit based on the invention of FIG. 2 but in which the bias is applied separately to each transistor Q1 and Q2 in the differential pair rather than in common mode (FIG. 2). More particularly, instead of just one static bias constant current source 16 as in FIG. 2, FIG. 4 uses two constant current sources 16, each connected between a respective transistor Q1 or Q2 and the negative voltage source VEE−, and instead of two resistors 12 and 13 the FIG. 4 embodiment uses a single degeneration resistor 12' which extends between the emitters of transistors Q1 and Q2.

The dynamic biasing for each transistor Q1 and Q2 is provided by a pair of NPN transistors Q3 and Q4 which, as in FIG. 2, have their collectors connected to the positive voltage source VCC+ and their bases arranged to receive the differential ac voltage v+', v−'. However, their emitters, instead of being connected together through a single constant current source, are connected through two respective constant current sources 26 to the negative voltage source VEE−. Instead of a single transistor Q5 as in FIG. 2, the circuit of FIG. 4 makes use of two NPN transistors Q5 and Q6. The base of transistor Q5 is connected to the emitter of transistor Q3, the emitter of transistor Q5 is connected through a resistor R5 to negative voltage source VEE− and the collector of transistor Q5 is connected to the emitter of transistor Q1 of the differential pair. Similarly, the base of transistor Q6 is connected to the emitter of transistor Q4, the emitter of transistor Q6 is connected through a resistor R6 to negative voltage source VEE− and the collector of transistor Q6 is connected to the emitter of transistor Q2 of the different pair. Thus, transistors Q5 and Q6 each operate as half-wave rectifiers, operating on opposing half-cycles of the differential input. Each rectified half-wave derived at the respective collectors of transistors Q5 and Q6 provides the dynamic biasing of the differential pair Q1 and Q2.

Transistors Q3 and Q4 serve as unity gain buffers that also may allow DC coupling between the inputs vi+, vi− of the differential pair and the inputs vi+', vi−' of the rectifier. Transistors Q3 and Q4 as well as current sources 26 could be excluded from the circuit which would necessitate ac coupling (or DC level shifting) in the circuit.

Figure 5:
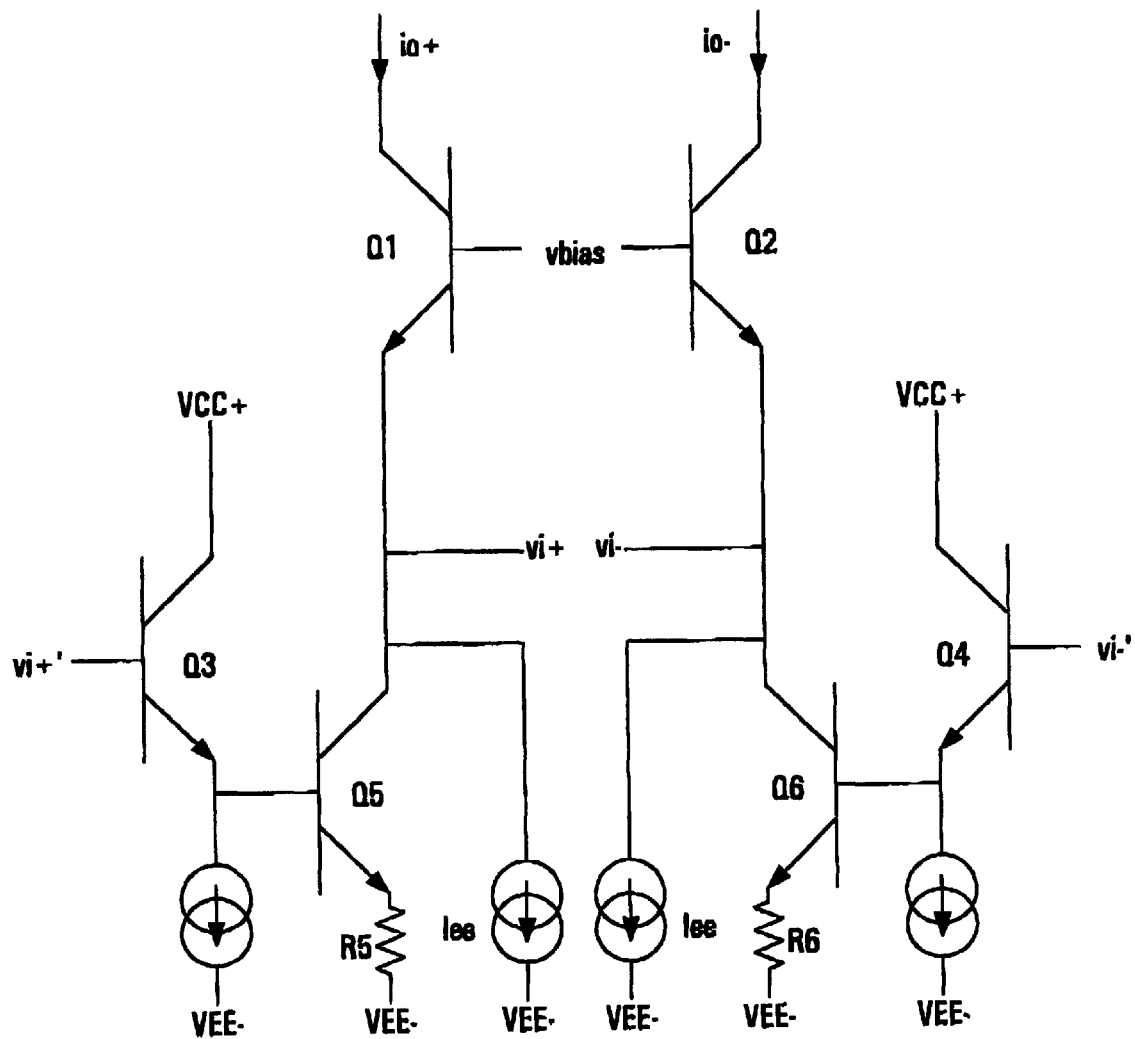
FIG. 5 is a diagram similar to FIG. 4 but illustrating the use of common-base inputs.

The invention can be applied to a differential pair connected in common-base mode as shown in FIG. 5. In this case a bias voltage source Vbias is connected to the bases of both transistors Q1 and Q2 of the pair and the differential input signal vi+, vi− is applied across the emitters. Otherwise, the static and dynamic bias circuitry is identical to the shown in FIG. 4.

Figure 6:
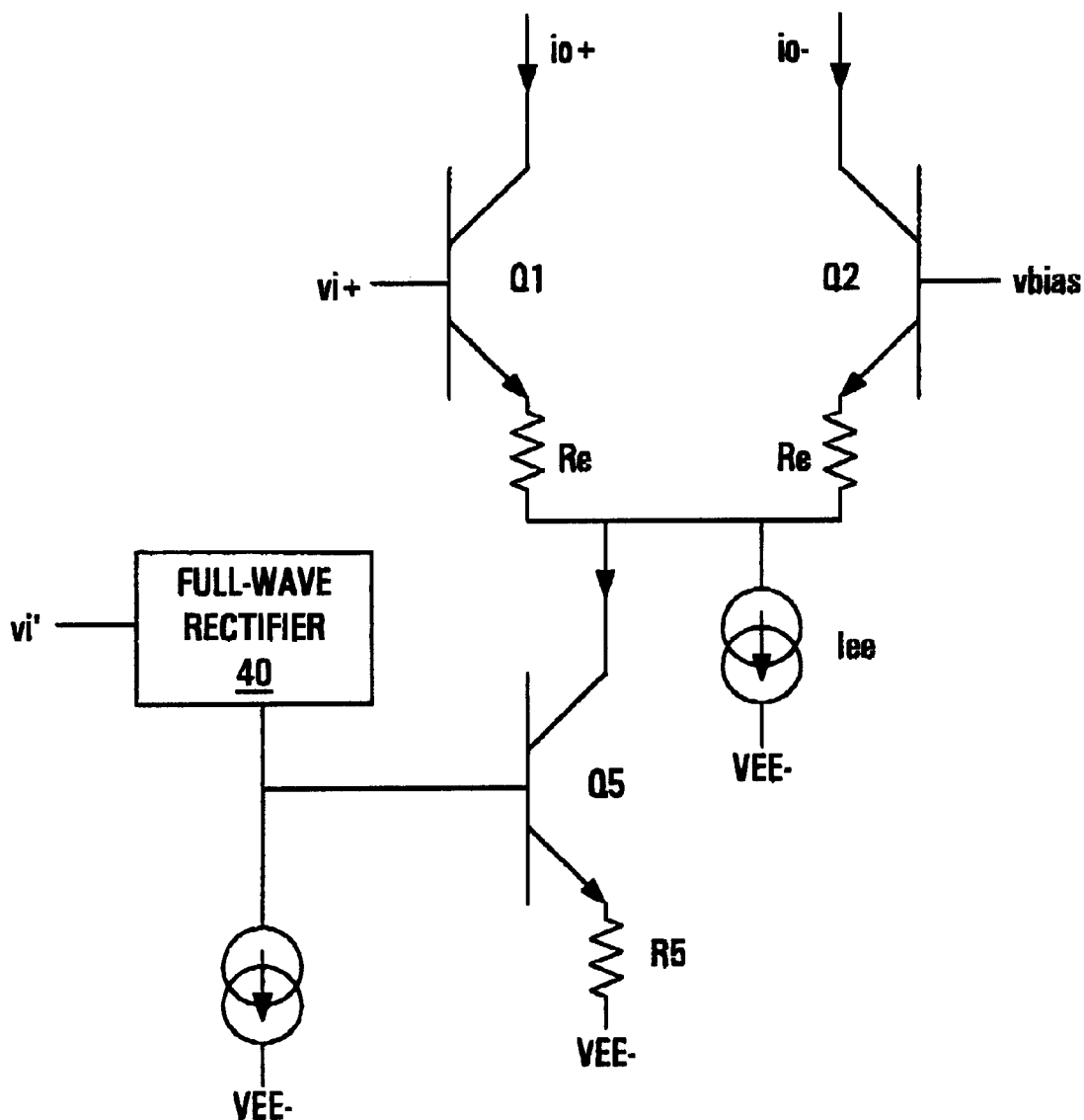
FIG. 6 is a diagram similar to FIG. 2 but illustrating the use of a single-ended input.

The invention may also be used with a differential pair in which the input voltage signal is applied in single-ended fashion as shown in FIG. 6. Here, the differential pair Q1, Q2 is connected in common emitter mode as in FIG. 2 but the input voltage vi is applied to the base of transistor Q1 only. The base of transistor Q2 is connected to a constant bias voltage Vbias. The remainder of the differential pair circuit is identical to that shown in FIG. 2. The dynamic biasing circuit is also similar to that shown in FIG. 2 involving the sue of a transistor Q5 and resistor R5 but the full wave rectifier comprising a pair of transistors for receiving a differential driving voltage is replaced with a full wave rectifier 40 which is supplied with a single ended voltage vi' related to input voltage Vi and applies the rectified value of vi' to the base of transistor Q5. The full-wave rectifier may be implemented using techniques well-known to persons skilled in the art. Conceivable, also a half-wave rectifier could be used instead of a full-wave rectifier but a full-wave implementation is probably more effective.

Figure 7:
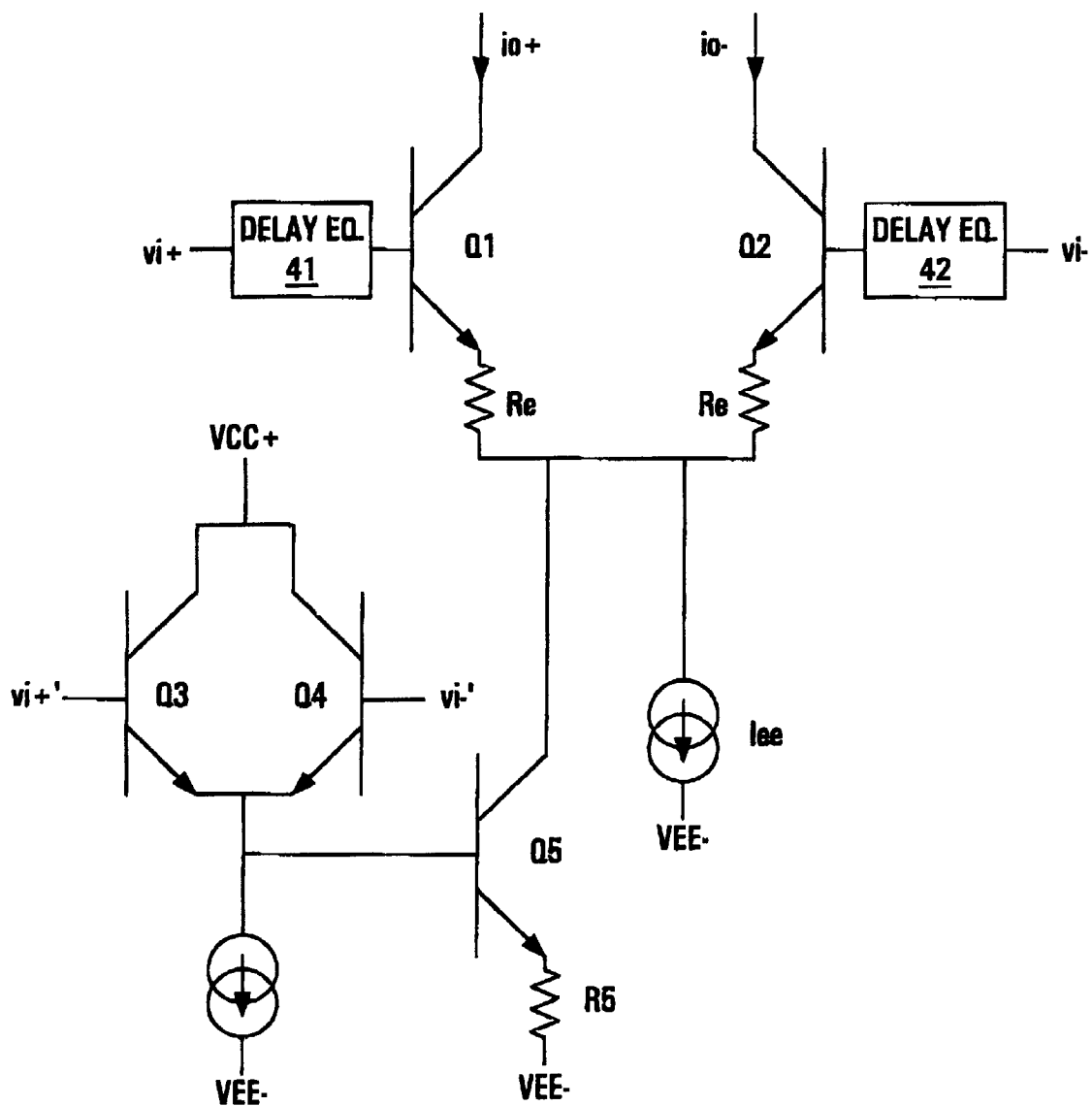
FIG. 7 is a diagram similar to FIG. 2 but illustrating a modification for higher bandwidth.

FIG. 7 is a representation of the circuit of FIG. 2 with the addition of time delay blocks 41 and 42 connected, respectively, between the base of transistor Q1 and the input for vi+ and between the base of transistor Q2 and the input for vi−. These delay blocks, which could be implemented as an emitter follower circuit, delay the input differential signal vi+, vi− with respect to the related differential voltage vi+', vi−' applied to the rectifier pair Q3 and Q4. This compensates for the delay occurring in the dynamic biasing circuit which could be unacceptable at higher frequencies.

Figure 8:
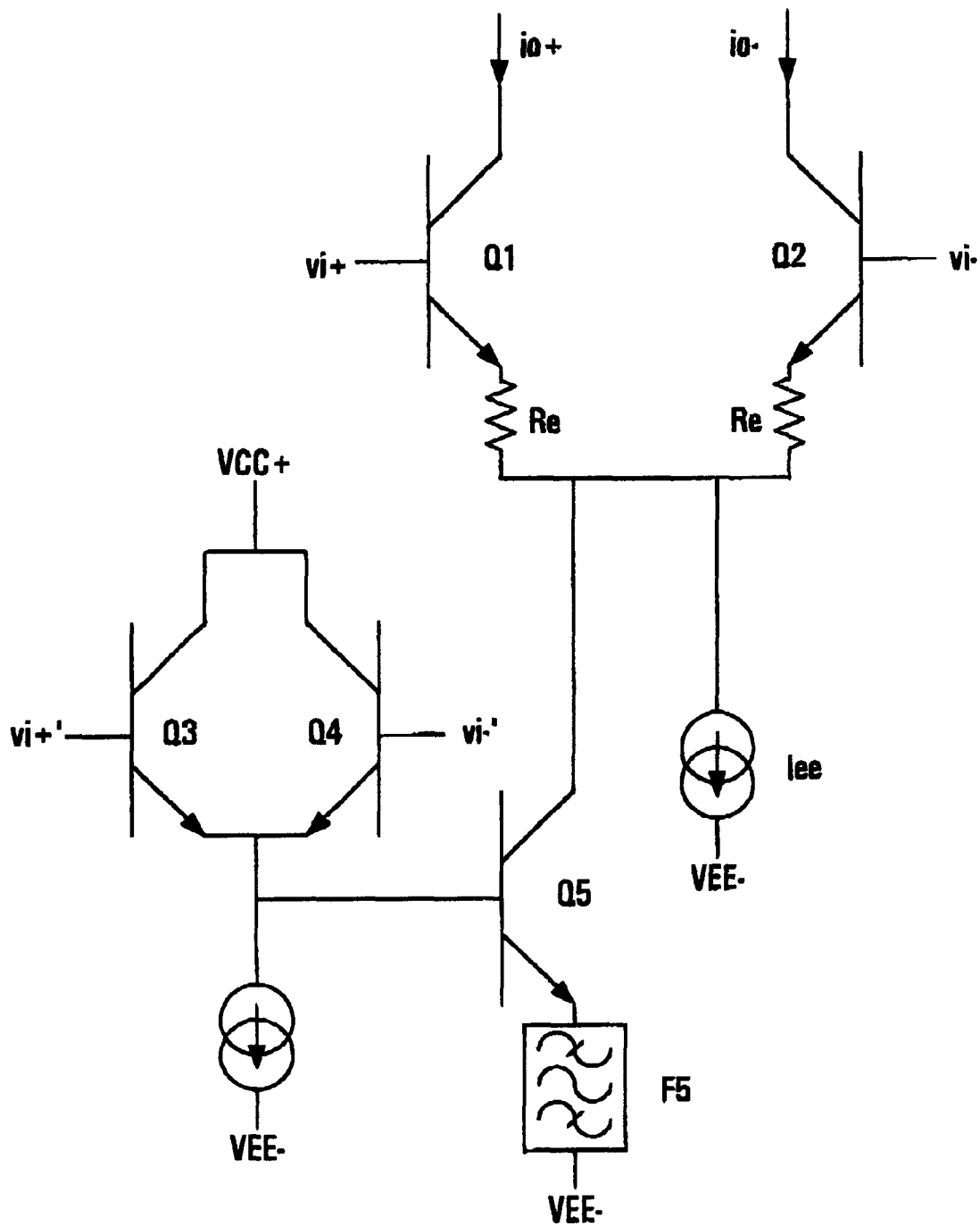
FIG. 8 is a diagram similar to FIG. 2 but incorporating frequency selectivity.

FIG. 8 shows an embodiment of the invention which is identical to that shown in FIG. 2 except that a band-pass filter F5 is connected between the emitter of transistor Q5 and VEE−. This provides frequency selectivity in that transistor Q5 will conduct only when vi+, vi− operates in the pass band of the filter F5, i.e. the dynamic bias is effective only when the input signal falls within the pass band. A high pass filter or other type of filter could be used instead of the pass band filter.

Figure 9:
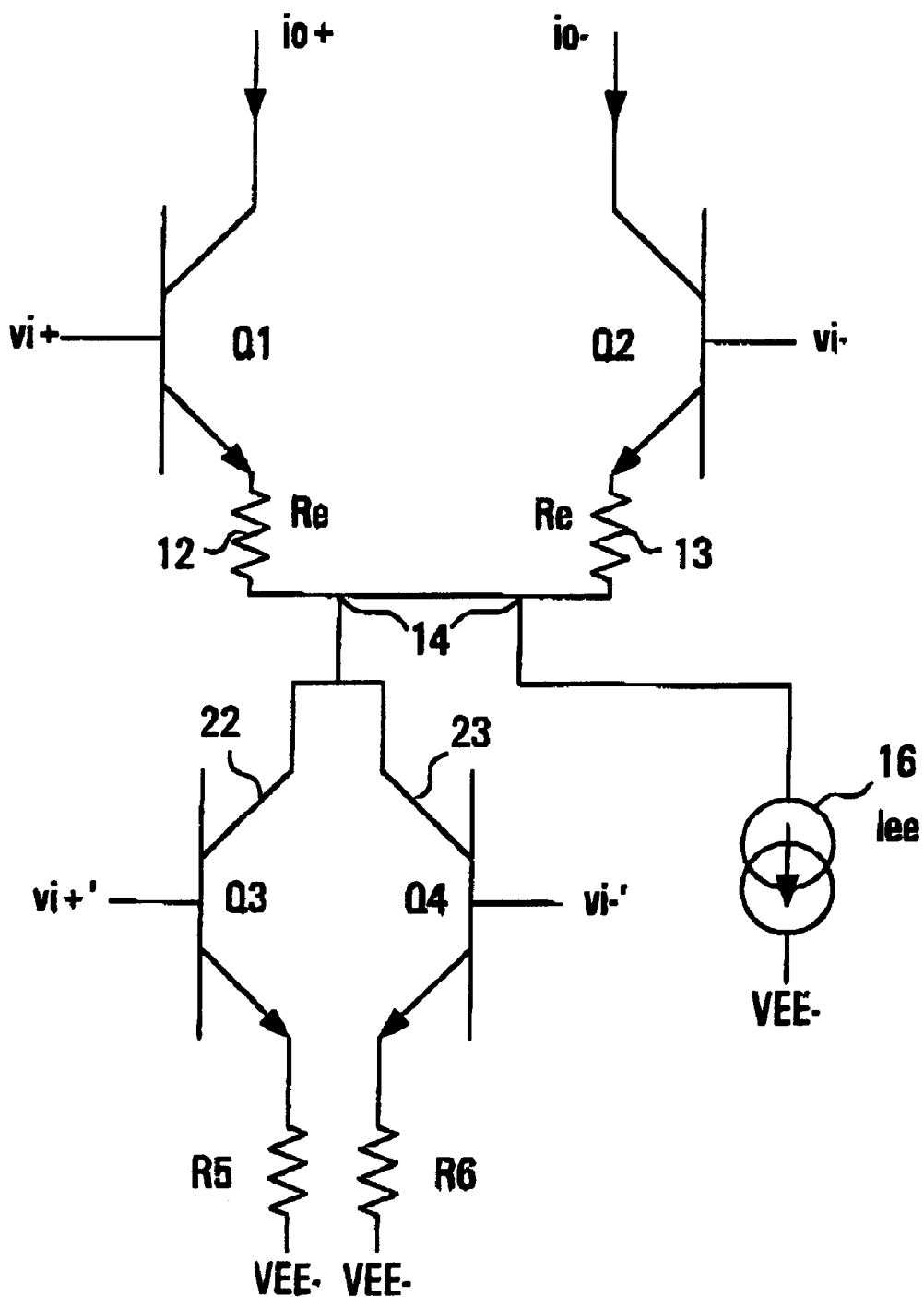
FIG. 9 is a diagram illustrating a modification which is a variant of FIGS. 2 and 4.

Finally, FIG. 9 shows and embodiment of the invention which may be considered to fall between the FIG. 2 embodiment and the FIG. 4 embodiment. In FIG. 9, there is a rectifier pair Q3, Q4 as in FIG. 2 with the ac voltage vi+', vi−' applied to the respective bases of transistors Q3, Q4 as in FIG. 2. However, the common collectors 22, 23 of transistors Q3, Q4 are not connected directly to a positive voltage source but are instead connected to the junction of the degenerative resistors 12, 13 of the differential pair Q1, Q2. The emitters 24, 25 of transistors Q3, Q4 on the other hand are connected through respective resistors R5 and R6, acting as constant current sources, to the negative voltage source VEE−.

This embodiment provides at the common collectors a full-wave rectified version of input ac voltage vi+', vi−', thereby providing dynamic bias to the differential pair Q1, Q2. This circuit would require ac coupling or DC level shifting between the differential pair Q1, Q2 and the rectifier pair Q3, Q4. For example, emitter followers could be connected to the rectifier inputs as in FIG. 4 to perform a DC level shifting function.

The FIG. 9 embodiment as with any other embodiment could, of course, be implemented in CMOS technology.

Although the preferred embodiments operate with dynamic bias in addition to static bias, the static bias circuitry could in some instances be removed by removing the constant current source 16. Also other types of rectifiers could be used or the rectifiers shown could be modified in a manner known per se, for example with the use of a smoothing capacitor to reduce ripple.

Programmability of the dynamic bias makes it possible to obtain an arbitrary output characteristic for a given input signal. This technique makes it potentially suitable for non-linear circuit applications as well (e.g. digital logic), where waveform shape can be tailored for improved performance (e.g. higher speeds, lower eye closure).

The technique is extendable to multiple sections (e.g. parallel compensation sections) to tailor the response.

The dynamic bias circuit can be designed to compensate for different operating conditions (e.g. to maintain consistent operation over temperature and process variations).

Although only FIG. 3 shows the use of a positive supply source VCC+ it should be understood that the outputs (i.e. the collectors or drains) of the differential pair must in every case be connected directly or indirectly to a bias voltage supply VCC+. This will be understood to persons skilled in the art.

While the preferred embodiment, in addition to alternative forms of the invention, has been described and illustrated, it will be apparent to one skilled in the art that further variations in the design may be made. The scope of

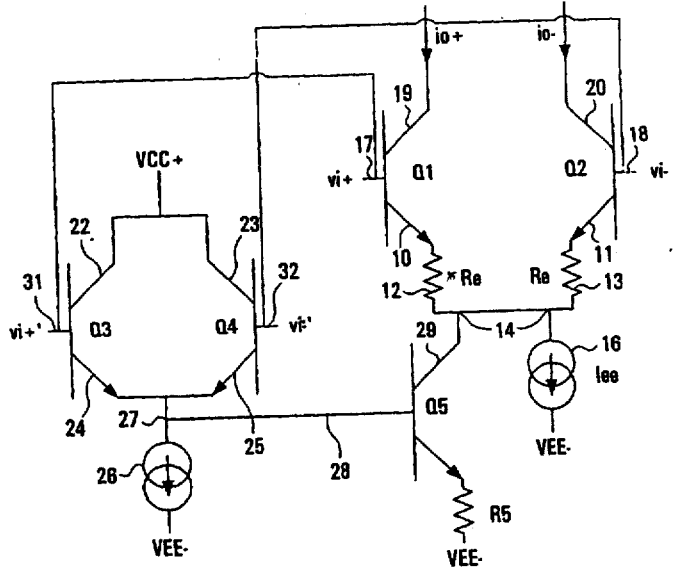

What is claimed is:

1. An amplifier circuit comprising a differential pair of NPN transistors each having a base, emitter and collector, the emitters being connected through respective degeneration resistors to a common first constant current source in turn connected to a negative voltage supply, the bases being arranged to receive a differential input voltage signal and the collectors being arranged to derive a differential output current, wherein the amplifier circuit further comprises a dynamic bias circuit comprising:
   a bias NPN transistor having a collector connected to the degeneration resistors, an emitter connected to the negative voltage supply and a base; and
   a full-wave rectifier formed by two NPN transistors having emitters connected in common through a second constant current source to the negative voltage supply, collectors connected in common to a positive supply source and bases arranged to receive a differential ac voltage chosen to have a predetermined relation to the input voltage signal, the common emitters being connected to the base of the bias transistor, whereby the amount of bias current applied to the differential pair varies dynamically depending upon the magnitude of the differential ac voltage.

2. An amplifier circuit comprising a differential pair of NPN transistors each having a base, emitter and collector, the emitters being connected through respective degeneration resistors to a common first constant current source in turn connected to a negative voltage supply, the bases being arranged to receive a differential input voltage signal and the collectors being arranged to derive a differential output current, wherein the amplifier circuit further comprises a dynamic bias circuit comprising:
   a full-wave rectifier formed by two NPN transistors having emitters connected through second respective constant current sources to the negative voltage supply, collectors connected in common to a junction between the degeneration resistors and the first constant current source and bases arranged to receive a differential ac voltage chosen to have a predetermined relation to the differential input voltage signal, whereby the amount of bias applied to the differential pair varies dynamically depending upon the magnitude of the differential ac voltage.

3. An amplifier circuit comprising a differential pair of NMOS transistors each having a gate, source and drain, the sources being connected to a common first constant current source in turn connected to a negative supply voltage, the gates being arranged to receive a differential input voltage signal and the drains being arranged to derive a differential output current, wherein the amplifier circuit further comprises a dynamic bias circuit comprising:
   a full-wave rectifier formed by two NMOS transistors having sources connected through second constant current sources to the negative voltage supply, drains connected in common to a junction between the sources of the differential pair and the first constant current source and gates arranged to receive a differential ac voltage chosen to have a predetermined relation to the differential input voltage signal, whereby the amount of bias applied to the differential pair varies dynamically depending upon the magnitude of the differential ac voltage.

4. An amplifier circuit comprising a differential pair of transistors arranged to receive a differential input voltage signal and derive and output current and a dynamic bias circuit for providing bias current to the differential pair, wherein the dynamic bias circuit comprises:
   a bias transistor having a first electrode connected to the differential pair, a second electrode for connection to a bias voltage source and a third electrode; and
   a full-wave rectifier comprising a pair of transistors having first common electrodes connected through a constant current source to a bias voltage source, second common electrodes connected to another bias voltage source and third electrodes to which a differential ac voltage is applied, the first common electrodes serving as an output connected to the third electrode of the bias transistor, whereby the amount of bias current applied to the differential pair varies dynamically depending upon the differential ac voltage applied to the rectifier.

5. An amplifier circuit comprising a differential pair of transistors arranged to receive an input voltage signal and derive and output current and a dynamic bias circuit for providing bias current to the differential pair, wherein the dynamic bias circuit comprises:
   a bias transistor having a first electrode connected to the differential pair, a second electrode for connection to a bias voltage source and a third electrode; and
   a rectifier having an input dc coupled to receive the input voltage signal received by the differential pair and an output connected to the third electrode of the bias transistor, whereby the amount of bias current applied to the differential pair varies dynamically depending upon the input voltage signal received by the differential pair; and
   further comprising a delay circuit connected to an input of the differential pair such that the input voltage signal received by the differential pair is delayed relative to the input voltage signal applied to the input of the rectifier.

6. An amplifier circuit comprising a differential pair of transistors arranged to receive a differential input voltage signal and derive an output current and a dynamic bias circuit for providing bias current to the differential pair, wherein the dynamic bias circuit comprises:
   a bias transistor having a first electrode connected to the differential pair, a second electrode for connection to a bias voltage source and a third electrode; and
   a full-wave rectifier having an input for receiving a differential ac voltage and an output connected to the third electrode of the bias transistor, whereby the amount of bias current applied to the differential pair varies dynamically depending upon the differential ac voltage applied to the input of the full-wave rectifier; and
   further comprising a delay circuit connected to an input of the differential pair such that the input voltage signal received by the differential pair is delayed relative to the differential ac voltage applied to the input of the full-wave rectifier.

7. An amplifier circuit comprising a differential pair of transistors arranged to receive an input voltage signal and derive an output current and a dynamic bias circuit for providing bias current to the differential pair, wherein the dynamic bias circuit comprises:
   a bias transistor having a first electrode connected to the differential pair, a second electrode for connection to a bias voltage source and a third electrode; and
   a rectifier having an input for receiving an ac voltage and an output connected to the third electrode of the bias transistor whereby the amount of bias current applied to the differential pair varies dynamically depending upon the ac voltage applied to the input of the rectifier; and further comprising a filter connected to the bias transistor such that the dynamic bias is effective only for predetermined frequencies of input voltage signal.

8. An amplifier circuit comprising a differential pair of transistors arranged to receive an input voltage signal and derive an output current and a dynamic bias circuit for providing bias current to the differential pair, wherein the dynamic bias circuit comprises:

a bias transistor having a first electrode connected to the differential pair, a second electrode for connection to a bias voltage source and a third electrode; and a rectifier having an input for receiving an ac voltage and an output connected to the third electrode of the bias transistor whereby the amount of bias current applied to the differential pair varies dynamically depending upon the ac voltage applied to the input of the rectifier; and further comprising a static bias circuit connected to the differential pair in parallel to the dynamic bias circuit whereby the bias applied to the differential pair is the sum of the static bias and the dynamic bias.

9. An amplifier circuit according to claim 8 wherein the ac voltage applied to the input of the rectifier is chosen to have a predetermined relationship to the input voltage signal.

10. An amplifier circuit according to claim 9 wherein the ac voltage applied to the input of the rectifier is identical to the input voltage signal.

11. An amplifier circuit according to claim 10 wherein a dc coupling is provided between the differential pair and the input of the rectifier to permit the input voltage signal to be coupled to the input of the rectifier and thereby serve as the ac voltage.

12. An amplifier circuit according to claim 9 wherein the ac voltage applied to the input of the rectifier comprises a voltage identical to the input voltage signal superimposed on a dc voltage.

13. An amplifier circuit according to claim 12 wherein an ac coupling is provided between the differential pair and the input of the rectifier to permit the input voltage signal to be coupled to the input of the rectifier.

14. An amplifier circuit according to claim 8 wherein the ac voltage applied to the input of the rectifier is chosen such that wideband linearity response of the differential pair is improved.

15. An amplifier circuit according to claim 8 wherein the ac voltage applied to the input of the rectifier is chosen such that a predetermined non-linear response of the differential pair is obtained.

16. An amplifier circuit according to claim 8 wherein the input voltage signal received by the differential pair is a differential voltage signal, the ac voltage applied to the input of the rectifier is a differential voltage and the rectifier is a full-wave rectifier.

17. An amplifier circuit according to claim 8 wherein the differential pair and the bias transistor are all NPN bipolar transistors.

18. An amplifier circuit according to claim 4 wherein the differential pair, the bias transistor and the pair of transistors of the full-wave rectifier are all NPN bipolar transistors.

19. An amplifier circuit according to claim 8 wherein the differential pair and the bias transistor are all implemented as NMOS transistors.

20. An amplifier circuit according to claim 4 wherein the differential pair, the bias transistor and the pair of transistors of the full-wave rectifier are all implemented as NMOS transistors.

21. An amplifier circuit according to claim 8 wherein the input voltage signal received by the differential pair is applied as a single-ended input to only one of the transistors of the differential pair, the ac voltage applied to the input of the rectifier is also applied in single-ended fashion and the rectifier is a full-wave rectifier.

* * * * *

UNITED STATES PATENT AND TRADEMARK OFFICE
CERTIFICATE OF CORRECTION

PATENT NO. : 6,218,902 B1
DATED : April 17, 2001
INVENTOR(S) : William Kung

Page 1 of 2

It is certified that error appears in the above-identified patent and that said Letters Patent is hereby corrected as shown below:

Title page,
The title page showing an illustrative figure should be deleted, and substitute therefore the attached title page consisting of Figs. 2

Replace Fig. 2:

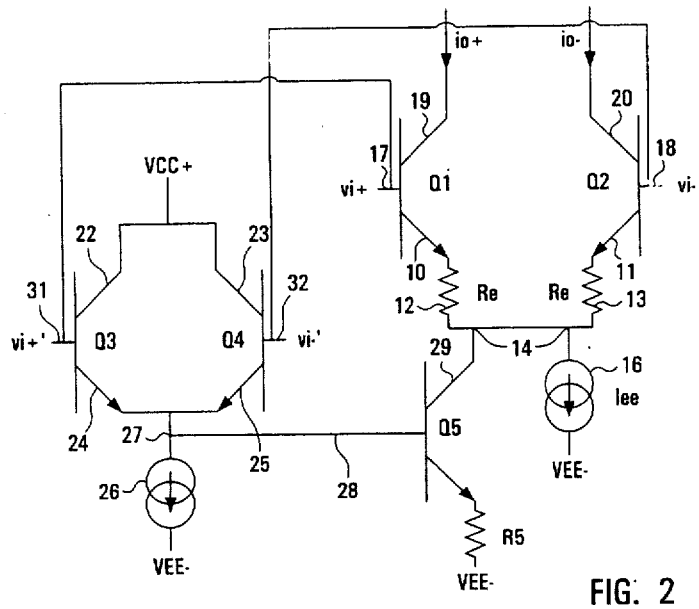

FIG. 2

Signed and Sealed this

Twenty-eighth Day of May, 2002

Attest:

JAMES E. ROGAN
Attesting Officer  Director of the United States Patent and Trademark Office

United States Patent
Kung

(10) Patent No.: US 6,218,902 B1
(45) Date of Patent: Apr. 17, 2001

(54) WIDE-BAND LINEARIZATION TECHNIQUE

(75) Inventor: William Kung, Nepean (CA)

(73) Assignee: Nortel Networks Limited, Montreal (CA)

(*) Notice: Subject to any disclaimer, the term of this patent is extended or adjusted under 35 U.S.C. 154(b) by 0 days.

(21) Appl. No.: 09/294,315

(22) Filed: Apr. 20, 1999

(51) Int. Cl.$^7$ ........................................................ H03F 3/45
(52) U.S. Cl. .................................... 330/261; 330/300
(58) Field of Search ................................ 330/252, 253, 330/261, 300

(56) References Cited

U.S. PATENT DOCUMENTS

| | | | |
|---|---|---|---|
| 3,619,797 | * | 11/1971 | Merrick .................................... 330/9 |
| 3,743,764 | * | 7/1973 | Wittmann ................................ 178/5.4 |
| 4,442,408 | * | 4/1984 | Le ............................................ 330/261 |
| 5,530,444 | * | 6/1996 | Tice et al. ............................... 341/156 |

OTHER PUBLICATIONS

B. Gilbert "The Micromixer: A Highly Linear Variant of the Gilbert Mixer Using a Bisymmetric Class–AB Input Stage", IEEE Journal of Solid–State Circuits, vol. 32, No. 9, Sep. 1997; pp. 1412 to 1423.

Z. Wang, "A Linearized Source–Coupled Pair with a Dynamic Bias Current", Microelectronics Journal, 23 (1992) pp. 301–304.

J. Durec, E. Main, D. Lovelace, "Motorola's Mosaic™ V silicon Bipolar RF Building Blocks Fill Gaps in High Performance Low Power Wireless Chip Sets", Proc. 4th Wireless Symposium, 1996, Santa Clara, CA. pp. 218–223.

* cited by examiner

*Primary Examiner*—Robert Pascal
*Assistant Examiner*—Henry Choe

(57) ABSTRACT

A conventional differential transistor pair is provided with a dynamic bias circuit. The input voltage signal for the differential pair is also full-wave rectified and the rectified signal is used to bias dynamically the differential pair while the input voltage signal is being applied. One or more bias transistors having a control electrode fed with the rectified signal is connected in series with the differential pair. The result is that as the input signal magnitude increases the amount of bias increases dynamically and increases linearly for larger signals. Desired responses other than linearity can be achieved by making the signal that is fed to the rectifier vary according to any predetermined function.

21 Claims, 8 Drawing Sheets